(12) United States Patent
Choi et al.

(10) Patent No.: US 8,742,404 B2
(45) Date of Patent: Jun. 3, 2014

(54) ORGANIC LIGHT EMITTING DISPLAY DEVICE AND MANUFACTURING METHOD THEREOF

(75) Inventors: Jong-Hyun Choi, Yongin (KR); Kyu-Sik Cho, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 383 days.

(21) Appl. No.: 13/045,184

(22) Filed: Mar. 10, 2011

(65) Prior Publication Data

US 2012/0091459 A1    Apr. 19, 2012

(30) Foreign Application Priority Data

Oct. 18, 2010  (KR) .................. 10-2010-0101413

(51) Int. Cl.
*H01L 29/08*    (2006.01)
*H01L 35/24*    (2006.01)
*H01L 51/00*    (2006.01)

(52) U.S. Cl.
USPC .................. 257/40; 257/57; 257/59; 438/149

(58) Field of Classification Search
USPC .................. 257/57, 59, 40; 438/149
See application file for complete search history.

(56) References Cited

U.S. PATENT DOCUMENTS

2007/0111369 A1* 5/2007 Chun et al. .............. 438/99
2009/0267486 A1* 10/2009 Kim et al. ............... 313/503
2010/0193790 A1* 8/2010 Yeo et al. ................ 257/59

FOREIGN PATENT DOCUMENTS

JP    2003-115393    4/2003
KR    10-2009-0021443    3/2009

* cited by examiner

*Primary Examiner* — Phat X Cao
(74) *Attorney, Agent, or Firm* — Robert E. Bushnell, Esq.

(57) ABSTRACT

An organic light emitting diode display comprises: a substrate; an active layer formed with a semiconductor material on the substrate; a first insulation layer formed on the semiconductor layer; a pixel electrode formed on the first insulation layer and generated by alternately stacking a plurality of pixel metal layers and a plurality of pixel transparent conductive layers; a gate electrode formed on the first insulation layer and formed in a configuration different from that of the pixel electrode; a second insulation layer formed on the first insulation layer so as to cover the gate electrode with an insulation layer opening for revealing the pixel electrode; a source electrode and a drain electrode respectively formed on the second insulation layer and electrically connected to the active layer; an organic emission layer formed on the pixel electrode; and a common electrode formed on the organic emission layer.

28 Claims, 9 Drawing Sheets

ORGANIC LIGHT EMITTING DISPLAY DEVICE AND MANUFACTURING METHOD THEREOF

CLAIM OF PRIORITY

This application makes reference to, incorporates the same herein, and claims all benefits accruing under 35 U.S.C. §119 from an application earlier filed in the Korean Intellectual Property Office on the 18 of Oct. 2010 and there duly assigned Serial No. 0-2010-0101413.

BACKGROUND OF THE INVENTION

1. Field of the Invention

The present invention relates generally to an excellent-quality organic light emitting diode (OLED) display and a manufacturing method thereof.

2. Description of the Related Art

An organic light emitting diode (OLED) display has been paid much attention as a next-generation display because of its advantageous characteristics, such as a wide viewing angle, a fast response rate, and relatively less power consumption, as well as less weight and a slim size.

In order for the organic light emitting diode (OLED) display to efficiently realize a full color system, a resonant structure for changing optical lengths of respective wavelengths emitted by an organic emission layer must be adopted.

The above information disclosed in this Background section is only for enhancement of an understanding of the background of the described technology, and therefore it may contain information which does not form the prior art which is already known in this country to a person of ordinary skill in the art.

SUMMARY OF THE INVENTION

The present invention has been developed in an effort to provide an organic light emitting diode (OLED) display which can be manufactured easily by a wide-area process while providing excellent quality, and a manufacturing method thereof.

An exemplary embodiment of the invention provides an organic light emitting diode display comprising: a substrate; an active layer formed with a semiconductor material on the substrate; a first insulation layer formed on the semiconductor layer; a pixel electrode formed on the first insulation layer and generated by alternately stacking a plurality of pixel metal layers and a plurality of pixel transparent conductive layers; a gate electrode formed on the first insulation layer and having a different configuration from the pixel electrode; a second insulation layer formed on the first insulation layer so as to cover the gate electrode with an insulation layer opening for revealing the pixel electrode; a source electrode and a drain electrode respectively formed on the second insulation layer and electrically connected to the active layer; an organic emission layer formed on the pixel electrode; and a common electrode formed on the organic emission layer.

The pixel metal layer includes silver (Ag) or an alloy of silver.

The plurality of pixel metal layers include a first pixel metal layer and a second pixel metal layer, and the first pixel metal layer and the second pixel metal layer each have a thickness within the range of 20 Å to 130 Å.

A sum of the thicknesses of the first pixel metal layer and the second pixel metal layer is within the range of 100 Å to 200 Å.

The pixel electrode is formed on the same layer as the gate electrode.

The pixel transparent conductive layer includes at least one of indium tin oxide (ITO), indium zinc oxide (IZO), zinc oxide (ZnO), indium oxide ($In_2O_3$), indium gallium oxide (IGO), and aluminum zinc oxide (AZO).

The plurality of pixel metal layers of the pixel electrode and an end of the plurality of pixel transparent conductive layers have the same etching side.

The gate electrode includes at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The pixel electrode transmits part of the light output by the organic emission layer and reflects another part thereof.

The common electrode reflects the light output by the organic emission layer.

An auxiliary transparent conductive layer is formed between the pixel electrode and the first insulation layer, and between the gate electrode and the first insulation layer.

The auxiliary transparent conductive layer includes at least one of indium tin oxide (ITO), indium zinc oxide (IZO), zinc oxide (ZnO), indium oxide ($In_2O_3$), indium gallium oxide (IGO), and aluminum zinc oxide (AZO).

The organic light emitting diode display further includes a first capacitor electrode formed with a semiconductor material in the same layer as the active layer, and a second capacitor electrode formed so as to overlap the first capacitor with the same layer and material as the gate electrode.

An impurity is doped into the first capacitor electrode.

Another embodiment of the invention provides a method for manufacturing an organic light emitting diode display, the method comprising the steps of: forming an active layer, made of a semiconductor material, on a substrate; forming a first insulation layer for covering the active layer; forming a gate electrode on the first insulation layer; alternately stacking metal layers and transparent conductive layers on the first insulation layer, and patterning them to form a pixel electrode made of the alternately stacked pixel metal layers and the transparent conductive layers; forming a second insulation layer for covering the gate electrode and revealing the pixel electrode; forming a source electrode and a drain electrode electrically connected to the active layer on the second insulation layer; forming an organic emission layer on the pixel electrode; and forming a common electrode on the organic emission layer.

The pixel electrode is selectively formed between the step of forming the gate electrode and the step of forming the organic emission layer.

The pixel electrode and the gate electrode have different configurations, and are formed by different photolithography processes.

The pixel electrode is formed in the same layer as the gate electrode.

The pixel metal layer includes silver (Ag) or an alloy of silver.

The plurality of pixel metal layers include a first pixel metal layer and a second pixel metal layer, and the first pixel metal layer and the second pixel metal layer each have a thickness within the range of 20 Å to 130 Å.

A sum of the thicknesses of the first pixel metal layer and the second pixel metal layer is within the range of 100 Å to 200 Å.

The pixel transparent conductive layer includes at least one of indium tin oxide (ITO), indium zinc oxide (IZO), zinc oxide (ZnO), indium oxide ($In_2O_3$), indium gallium oxide (IGO), and aluminum zinc oxide (AZO).

The gate electrode includes at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An auxiliary transparent conductive layer is formed between the pixel electrode and the first insulation layer, and between the gate electrode and the first insulation layer.

The auxiliary transparent conductive layer includes at least one of indium tin oxide (ITO), indium zinc oxide (IZO), zinc oxide (ZnO), indium oxide ($In_2O_3$), indium gallium oxide (IGO), and aluminum zinc oxide (AZO).

The method further includes the step, once the gate electrode is formed, of doping an ion impurity into a partial region of the active layer by using the gate electrode as a mask.

The method further includes the step of forming an organic emission layer on the pixel electrode, and the step of forming a common electrode on the organic emission layer.

The first capacitor electrode is formed with the active layer in the forming of an active layer, and the second capacitor electrode is formed with the gate electrode so as to overlap the first capacitor in the forming of a gate electrode.

An impurity is doped into the first capacitor electrode.

According to the exemplary embodiments of the invention, the organic light emitting diode (OLED) display is easy to manufacture by a wide-area process and has excellent quality.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
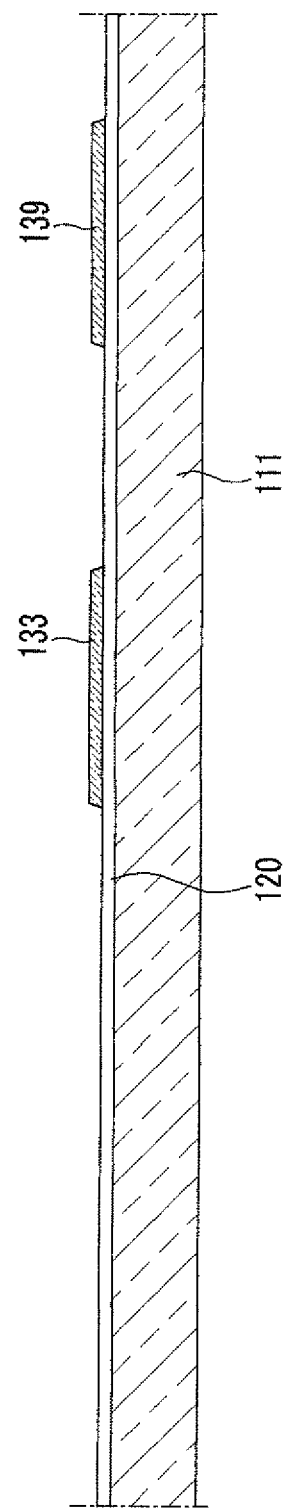
FIG. 1 thru FIG. 5, FIG. 7 and FIG. 8 are sequential cross-sectional views of an organic light emitting diode (OLED) display manufacturing process according to an exemplary embodiment of the invention.

The present invention will now be described more fully with reference to the accompanying drawings, in which exemplary embodiments of the invention are shown. As those skilled in the art will realize, the described embodiments may be modified in various different ways, all without departing from the spirit or scope of the present invention.

Like reference numerals designate like elements throughout the specification.

The size and thickness of each component shown in the drawings are arbitrarily shown for understanding and ease of description, but the present invention is not limited thereto. In the drawings, the thickness of layers, films, panels, regions, etc. are exaggerated for clarity. It will be understood that, when an element such as a layer, film, region or substrate is referred to as being "on" another element, it can be directly on the other element or intervening elements may also be present.

An organic light emitting diode (OLED) display and a manufacturing method thereof according to an exemplary embodiment will now be described with reference to FIG. 1 thru FIG. 9.

The method for manufacturing the organic light emitting diode (OLED) display 101 according to an exemplary embodiment will now be described with respect to a thin film transistor 10, an organic light emitting element 70, and a capacitor 90 (see FIG. 9) according to their stacked order.

As shown in FIG. 1, a buffer layer 120 is formed on a substrate 111. An active layer 133 and a first capacitor electrode 139 are formed on the buffer layer 120.

The substrate 111 is formed as a transparent insulating substrate made of glass, quartz, ceramic, or plastic. However, the exemplary embodiment is not restricted thereto, and the substrate 111 may be formed as a metallic substrate made of stainless steel. Furthermore, when the substrate 111 is made of plastic, it may be formed so as to be a flexible substrate.

The buffer layer 120 is formed as a single layer or multiple layers, including at least one of a silicon oxide layer and a silicon nitride layer, by using chemical vapor deposition or physical vapor deposition, which are known to a person skilled in the art.

The buffer layer 120 prevents diffusion or penetration of moisture or impurities generated from the substrate 111, smoothes the surface, and controls the transmission speed of heat during a crystallization process for forming a semiconductor layer.

The buffer layer 120 can be omitted depending on the type of substrate 111 and process conditions.

The active layer 133 and the first capacitor electrode 139 are formed on the buffer layer 120. The active layer 133 and the first capacitor electrode 139 are formed by patterning a thin film made of a semiconductor material, including an amorphous silicon layer, a polysilicon layer or an oxide semiconductor layer. That is, the active layer 133 and the first capacitor electrode 139 are patterned through a first photolithography process.

The polysilicon layer can be formed by forming an amorphous silicon layer and crystallizing it. In this instance, the amorphous silicon layer can be crystallized by various methods known to a person skilled in the art, such as solid phase crystallization, excimer laser crystallization, metal induced crystallization (MIC), metal induced lateral crystallization (MILC), sequential lateral solidification (SLS), and super grain silicon (SGS) crystallization.

However, the exemplary embodiment is not restricted thereto. Therefore, the first capacitor electrode 139 can be formed in a layer different from the active layer 133 or can be formed of a material different from the material of the active layer 133 without being patterned with the active layer 133.

Figure 2:
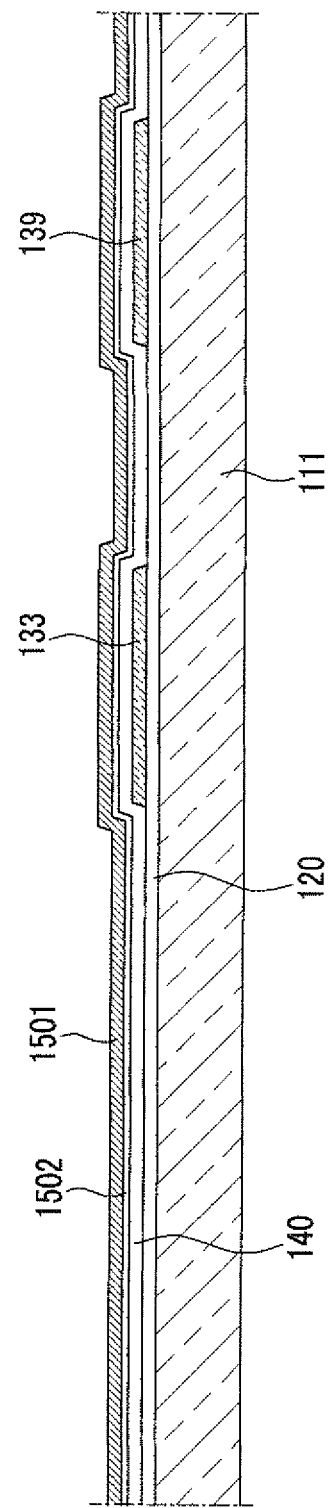

As shown in FIG. 2, a first insulation layer 140 is formed on the semiconductor layer 133 and the first capacitor electrode 139. In detail, the first insulation layer 140 is formed over the buffer layer 120 so as to cover the semiconductor layer 133 and the first capacitor electrode 139. The first insulation layer 140 is formed inclusive of various insulating materials known to a person skilled in the art, such as tetraethyl orthosilicate (TEOS), SiNx, and $SiO_2$. The first insulation layer 140 insulates the active layer 133 and the gate electrode 153 from each other, and functions as a dielectric layer of the capacitor 90. An auxiliary transparent conductive layer 1502 and a gate wire metal layer 1501 are sequentially stacked on the first insulation layer 140.

The auxiliary transparent conductive layer 1502 may include at least one of indium tin oxide (ITO), indium zinc oxide (IZO), zinc oxide (ZnO), indium oxide (In$_2$O$_3$), indium gallium oxide (IGO), and aluminum zinc oxide (AZO).

The gate wire metal layer 1501 may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

Figure 3:
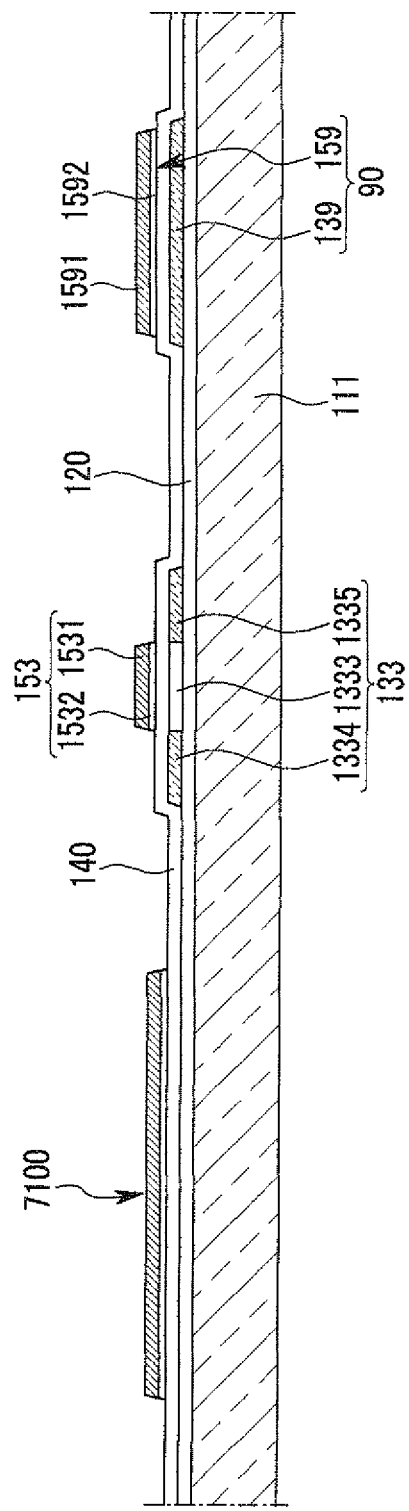

As shown in FIG. 3, a gate electrode 153, a second capacitor electrode 159, and a pixel electrode intermediate 7100 are formed by patterning the auxiliary transparent conductive layer 1502 and the gate wire metal layer 1501 of FIG. 2 by a second photolithography process. In this regard, the pixel electrode intermediate 7100 may be omitted. Also, the gate wire metal layer 1501 may be multiple layers formed with different metals.

The gate electrode 153 includes a gate metal layer 1531 and a gate auxiliary transparent conductive layer 1532, and the second capacitor electrode 159 includes a capacitor metal layer 1591 and a capacitor auxiliary transparent conductive layer 1592. However, the exemplary embodiment is not limited thereto. Therefore, the gate electrode 153 and the second capacitor electrode 159 can be formed with the gate metal layer 1531 and capacitor metal layer 1591, respectively, by excluding the gate auxiliary transparent conductive layer 1532 and the capacitor auxiliary transparent conductive layer 1592, respectively.

The first capacitor electrode 139, the second capacitor electrode 159, and the first insulation layer 140 between the first capacitor electrode 139 and the second capacitor electrode 159 form the capacitor 90.

Also, the second capacitor electrode 159 is not patterned, and is formed with the gate electrode 153, and can be formed in another layer different from that of the gate electrode 153.

An ion impurity is doped into a partial region of the active layer 133 by using the gate electrode 153 as a self aligning mask. The impurity-doped partial region of the active layer 133 becomes a source region 1334 and a drain region 1335. The region overlapping the gate electrode 153 and not doped with the impurity becomes a channel region 1333. The source region 1334 and the drain region 1335 are disposed on both sides of the channel region 1333. Accordingly, in the exemplary embodiment, no additional mask is added and an ion impurity is doped into a partial region of the active layer 133 so as to form the source region 1334 and the drain region 1335.

Figure 4:
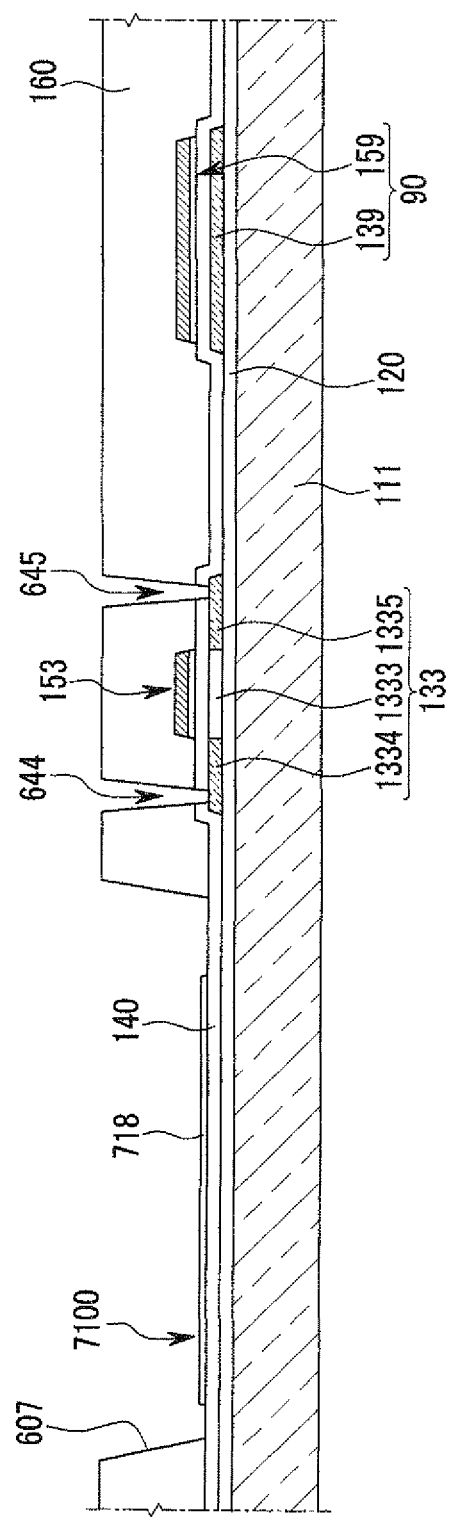

As shown in FIG. 4, a second insulation layer 160 for covering the gate electrode 153 and the second capacitor electrode 159 is formed by using an insulation layer opening 607 for revealing the pixel electrode intermediate 7100.

Also, the second insulation layer 160 and the first insulation layer 140 have a plurality of contact holes 644 and 645 for revealing parts of the source region 1334 and the drain region 1335, respectively, of the active layer 133.

The plurality of contact holes 644 and 645 and the insulation layer opening 607 are formed by a third photolithography process. In the case of the pixel electrode intermediate 7100, a pixel auxiliary transparent conductive layer 718 remains and other parts are removed.

In this regard, the gate wire metal layer 1501 (FIG. 2) formed on the pixel auxiliary transparent conductive layer 718 (FIG. 4) can be removed by the second photolithography process for patterning the gate electrode 153 and the first capacitor electrode 159. In this case, the second photolithography process may include a halftone exposure process or a double exposure process.

Figure 5:
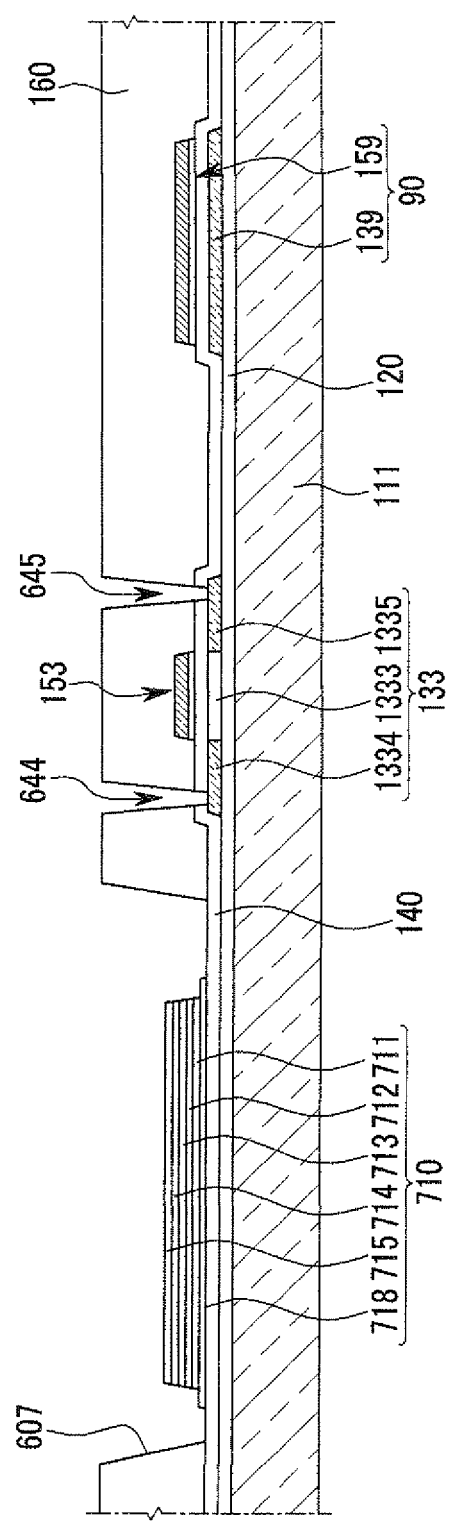

As shown in FIG. 5, a plurality of pixel metal layers 712 and 714 and a plurality of pixel transparent conductive layers 711, 713 and 715 are alternately stacked on the pixel auxiliary transparent conductive layer 718 so as to complete a pixel electrode 710. Therefore, the pixel electrode 710 is formed on the first insulation layer 140 in the insulation layer opening 607. That is, the pixel electrode 710 has a configuration different from that of the gate electrode 153, and is formed on the same layer as the gate electrode 153. Also, the pixel electrode 710 and the gate electrode 153 are formed through different photolithography processes.

The plurality of pixel metal layers 712 and 714 and the plurality of pixel transparent conductive layers 711, 713 and 715 are formed by alternately stacking the metal layer and transparent conductive layer, and patterning them by a fourth photolithography process.

At least one of a plurality of pixel metal layers 712 and 714 includes silver (Ag) or an alloy of silver. For example, part of the plurality of pixel metal layers 712 and 714 may include silver (Ag) or an alloy of silver, while the other part thereof may include an aluminum alloy. However, in order to maximize the optical transmittance characteristic and the optical reflective characteristic of the pixel electrode 710, it will be more efficient for a plurality of pixel metal layers 712 and 714 to include silver (Ag) or an alloy of silver with great efficiency of transmittance and reflection.

Also, the pixel transparent conductive layers 711, 713, and 715 may include at least one of indium tin oxide (ITO), indium zinc oxide (IZO), zinc oxide (ZnO), indium oxide (In$_2$O$_3$), indium gallium oxide (IGO), and aluminum zinc oxide (AZO).

In detail, the pixel electrode 710 includes a first pixel transparent conductive layer 711, a first pixel metal layer 712, a second pixel transparent conductive layer 713, a second pixel metal layer 714, and a third pixel transparent conductive layer 715 which are sequentially stacked. However, the exemplary embodiment is not restricted thereto.

Figure 6:
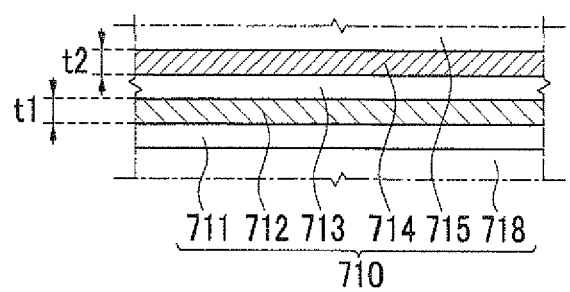
FIG. 6 is a magnified cross-sectional view of a pixel electrode of an organic light emitting diode (OLED) display according to an exemplary embodiment of the invention.

As shown in FIG. 6, the first pixel metal layer 712 is formed so as to have a first thickness t1 and the second pixel metal layer 714 is formed so as to have a second thickness t2. The first thickness t1 and the second thickness t2 are within the range of 20 Å through 130 Å. When the first thickness t1 and the second thickness t2 are greater than 20 Å, the pixel electrode 710 can perform an efficient reflection function, and when the first thickness t1 and the second thickness t2 are less than 130 Å, the etching characteristic of the first pixel metal layer 712 and the second pixel metal layer 714 is acquired so as to form the first pixel metal layer 712 and the second pixel metal layer 714 with a plurality of pixel transparent conductive layers 711, 713 and 715 by a single etching process. Thus, the sides of the first pixel transparent conductive layer 711, the first pixel metal layer 712, the second pixel transparent conductive layer 713, the second pixel metal layer 714, and the third pixel transparent conductive layer 715 have the same etching side.

Also, the sum of the first thickness t1 and the second thickness t2 is in a range of 100 Å through 200 Å. When the sum of the first thickness t1 and the second thickness t2 is in a range of 100 Å to 200 Å, the first pixel metal layer 712 and the second pixel metal layer 714 have a reflection function and acquire an appropriate transmittance. Accordingly, the organic light emitting element 70 having the pixel electrode 710 according to an exemplary embodiment can efficiently realize optical resonance.

Therefore, since a plurality of pixel transparent conductive layers 711, 713 and 715 are formed with a material having a high absolute value of work function, the pixel electrode 710 can efficiently function as an anode. Also, since the pixel electrode 710 allows partial transmission and partial reflection, the organic light emitting diode (OLED) display 101 can efficiently have an optical resonant configuration.

Furthermore, since a plurality of pixel transparent conductive layers 711, 713, and 715 and a plurality of pixel metal layers 712 and 714 can be formed by one etching process, the entire manufacturing process of the organic light emitting diode (OLED) display 101 can be simplified.

Figure 7:
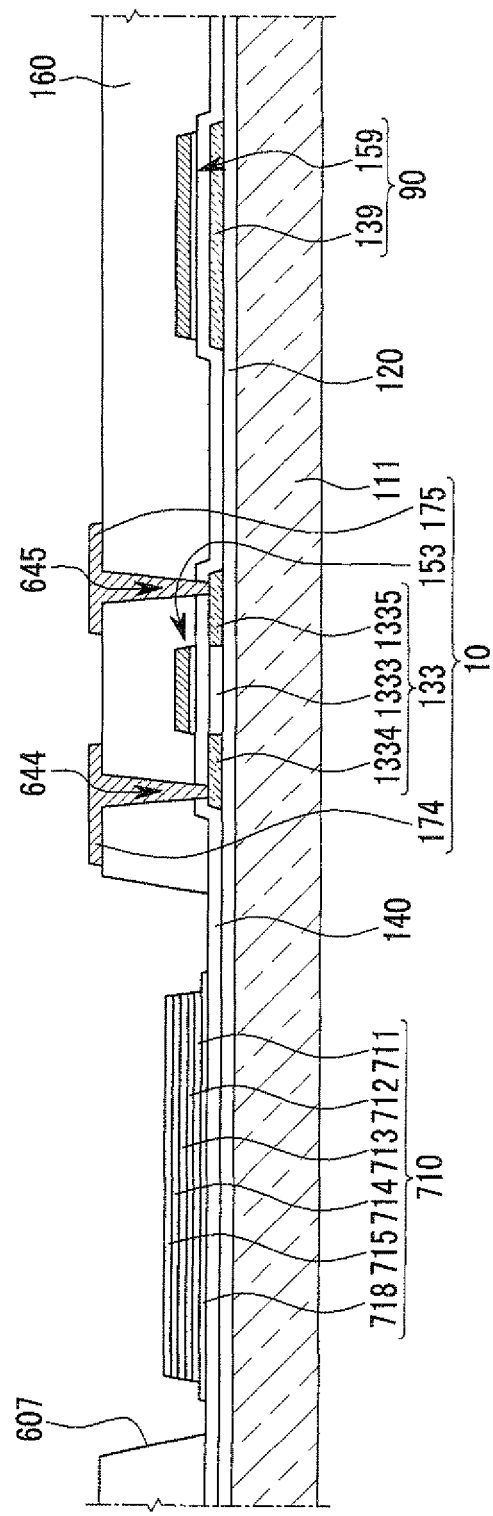

As shown in FIG. 7, a source electrode 174 and a drain electrode 175 are formed on the second insulation layer 160 by a fifth photolithography process. The source electrode 174 and the drain electrode 175 contact the source region 1334 and drain region 1335, respectively, of the active layer 133 through the contact holes 644 and 645, respectively, formed in the second insulation layer 160. Accordingly, a thin film transistor (TFT) 10, including the gate electrode 153, the active layer 1333, the source electrode 174 and the drain electrode 175, is completed.

The source electrode 174 and the drain electrode 175 can be formed so as to be a single layer or multiple layers by using various kinds of metals or alloys known to a person skilled in the art.

When the source electrode 174 and the drain electrode 175 are formed, the ion impurity may be doped into the first capacitor electrode 139. In detail, B or P ions are doped with a concentration of greater than $1\times10^{15}$ atoms/cm$^2$ with the first capacitor electrode 139 made of a semiconductor material as a target. Thus, the conductivity of the first capacitor electrode 139 is improved so as to increase the capacitance of the capacitor 90. The process for doping the ion impurity into the first capacitor electrode 139 can be omitted depending on the case, and can be undertaken in other stages.

Figure 8:
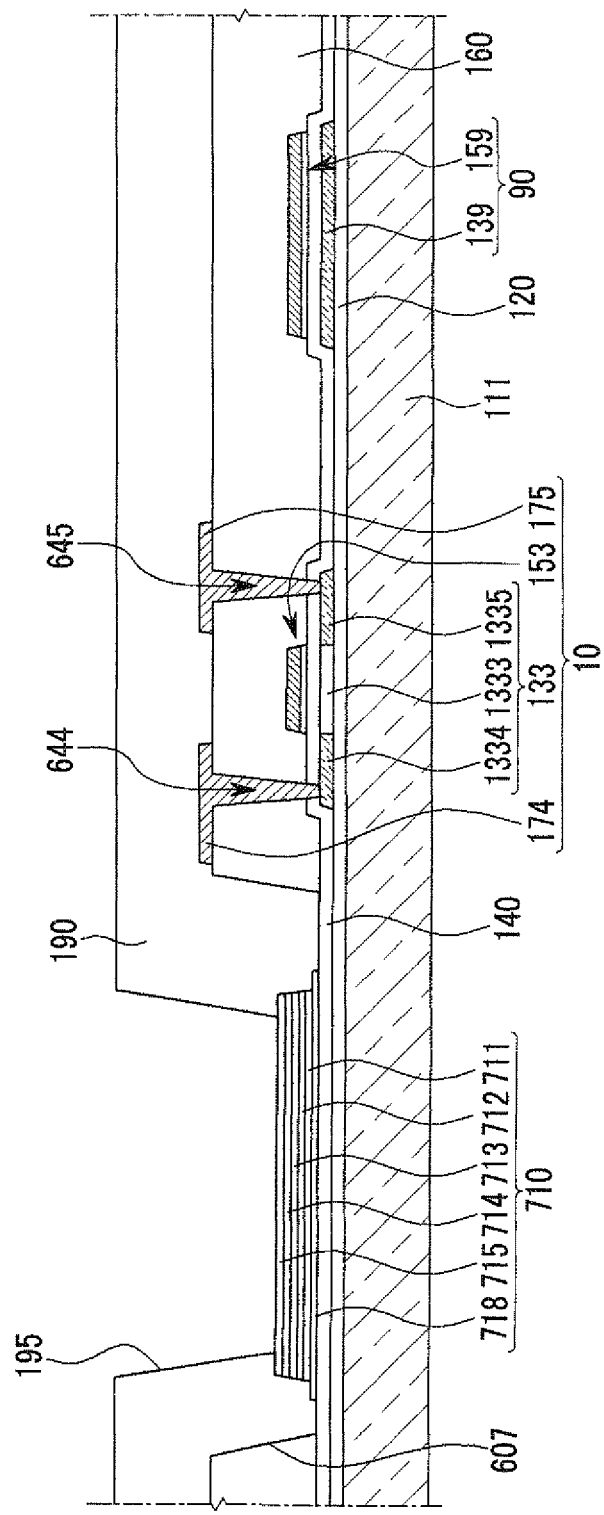

As shown in FIG. 8, a pixel definition layer 190 for covering the source electrode 174 and the drain electrode 175 is formed. The pixel definition layer 190 has a pixel opening 195 revealing at least a part of the pixel electrode 710. Throughout the specification, the term "at least a part" represents a part or the whole. The pixel definition layer 190 can be made with various kinds of organic materials or inorganic materials known to a person skilled in the art.

Figure 9:
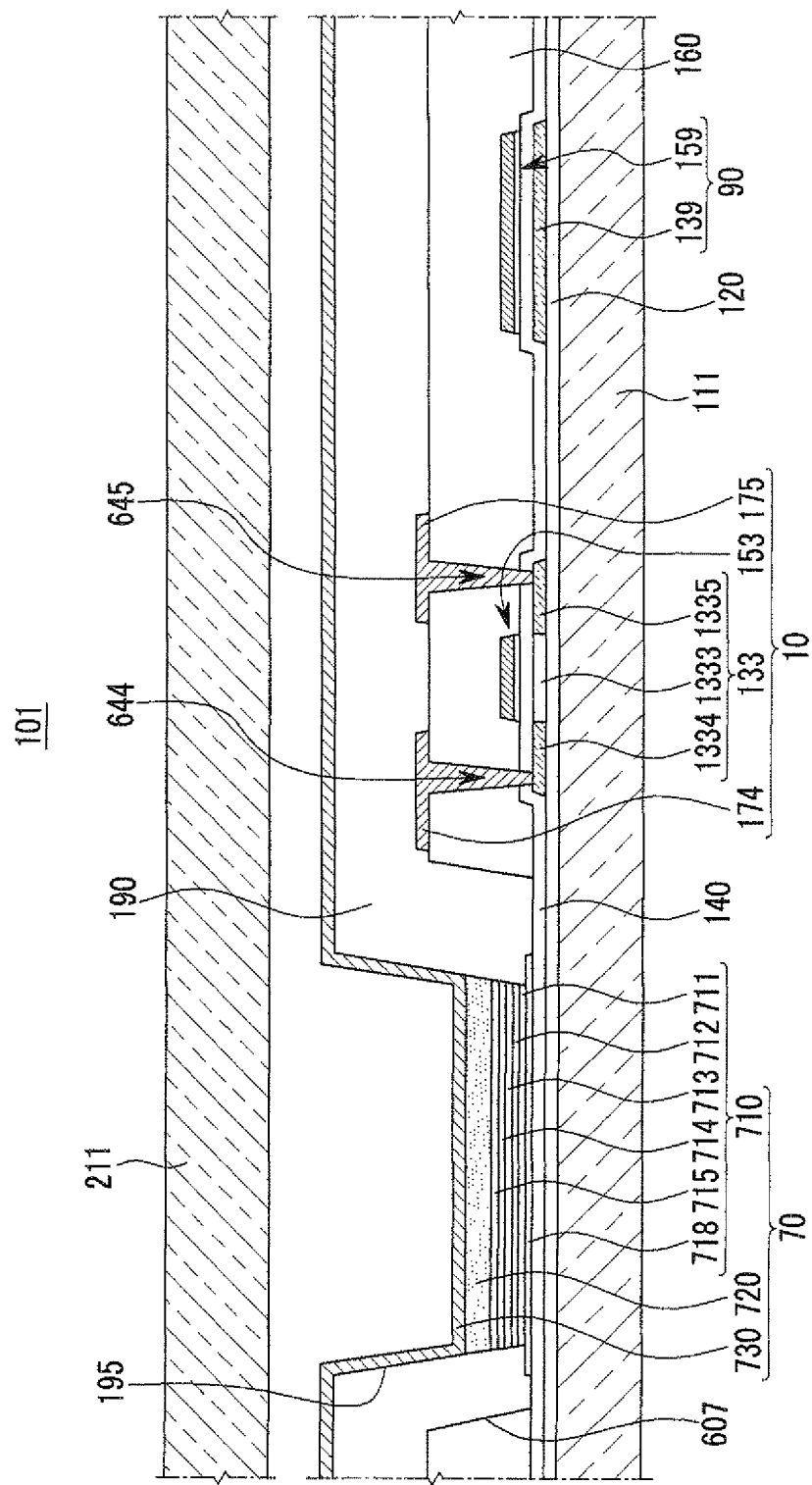
FIG. 9 is a cross-sectional view of an organic light emitting diode (OLED) display according to an exemplary embodiment of the invention.

As shown in FIG. 9, an organic emission layer 720 is formed on the pixel electrode 710 in the pixel opening 195. A low molecular weight organic material or a high molecular weight organic material is used for the organic emission layer 720.

The organic emission layer 720 stacks a hole transport layer (HTL) and a hole injection layer (HIL) in the direction of the pixel electrode 710 with respect to the emission layer, and stacks an electron transport layer (ETL) and an electron injection layer (EIL) in the direction of the common electrode 730. In addition, various other layers can be stacked.

Also, the organic light emitting diode (OLED) display 101 adopts an optical resonant configuration in which the thickness of the organic emission layer 720 is varied for each pixel.

A common electrode 730 is formed on the organic emission layer 720. The organic light emitting diode (OLED) display 101 uses the pixel electrode 710 as the anode and the common electrode 730 as the cathode. However, the exemplary embodiment is not restricted thereto, and the polarities of the pixel electrode 710 and the common electrode 730 may be applied in the opposite manner.

The common electrode 730 is made of a material including a reflection material so as to realize the optical resonant configuration. In detail, the common electrode 730 can be made of Al, Ag, Mg, Li, Ca, LiF/Ca, or LiF/Al.

Therefore, the organic light emitting element 70, including the pixel electrode 710, the organic emission layer 720 and the common electrode 730, is completed.

A sealing member 211 for protecting the organic emission layer 720 from moisture or oxygen supplied from the outside is disposed on the common electrode 730.

Also in the exemplary embodiment, the fourth photolithography process for forming the pixel electrode 710 does not need to be performed between the third photolithography process and the fifth photolithography process. That is, the fourth photolithography process for forming the pixel electrode 710 can be selectively performed between the step of forming the gate electrode 153 and the step of forming the organic emission layer 720. In detail, the pixel electrode 710 can be formed before the second insulation layer 160 is formed, after the source electrode 174 and the drain electrode 175 is formed, or after the pixel definition layer 190 is formed.

The organic light emitting diode (OLED) display 101 according to the exemplary embodiment of the invention, as formed by the above-described manufacturing method, can efficiently achieve improved optical efficiency through the optical resonant configuration in the configuration of bottom emission in which the image is realized in the direction of the substrate 111, as shown in FIG. 9.

While this disclosure has been described in connection with what is presently considered to be practical exemplary embodiments, it is to be understood that the invention is not limited to the disclosed embodiments but, on the contrary, is intended to cover various modifications and equivalent arrangements included within the spirit and scope of the appended claims.

What is claimed is:

1. An organic light emitting diode display device, comprising:
    a substrate;
    an active layer formed with a semiconductor material on the substrate;
    a first insulation layer formed on the semiconductor layer;
    a pixel electrode formed on the first insulation layer and generated by alternately stacking a plurality of pixel metal layers and a plurality of pixel transparent conductive layers;
    a gate electrode formed on the first insulation layer and formed in a different configuration relative to a configuration of the pixel electrode;
    an auxiliary transparent conductive layer formed between the pixel electrode and the first insulation layer and between the gate electrode and the first insulation layer;
    a second insulation layer formed on the first insulation layer so as to cover the gate electrode with an insulation layer opening for revealing the pixel electrode;
    a source electrode and a drain electrode respectively formed on the second insulation layer and electrically connected to the active layer;
    an organic emission layer formed on the pixel electrode; and
    a common electrode formed on the organic emission layer.

2. The organic light emitting diode display device of claim 1, wherein each of the pixel metal layers comprise one of silver (Ag) and an alloy of silver.

3. The organic light emitting diode display device of claim 1, wherein the plurality of pixel metal layers include a first pixel metal layer and a second pixel metal layer, and the first pixel metal layer and the second pixel metal layer each have a thickness in a range of 20 Å to 130 Å.

4. The organic light emitting diode display device of claim 3, wherein a sum of thicknesses of the first pixel metal layer and the second pixel metal layer is in a range of 100 Å to 200 Å.

5. The organic light emitting diode display device of claim 2, wherein the pixel electrode is formed on a same layer as the gate electrode is formed.

6. The organic light emitting diode display device of claim 2, wherein the pixel transparent conductive layer includes at least one of indium tin oxide (ITO), indium zinc oxide (IZO), zinc oxide (ZnO), indium oxide ($In_2O_3$), indium gallium oxide (IGO), and aluminum zinc oxide (AZO).

7. The organic light emitting diode display device of claim 2, wherein the plurality of pixel metal layers of the pixel electrode and an end of the plurality of pixel transparent conductive layers have a same etching side.

8. The organic light emitting diode display device of claim 2, wherein the gate electrode includes at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

9. The organic light emitting diode display device of claim 2, wherein the pixel electrode transmits a part of light outputted by the organic emission layer and reflects another part of the light outputted by the organic emission layer.

10. The organic light emitting diode display device of claim 2, wherein the common electrode reflects the light outputted by the organic emission layer.

11. The organic light emitting diode display device of claim 1, wherein the auxiliary transparent conductive layer includes at least one of indium tin oxide (ITO), indium zinc oxide (IZO), zinc oxide (ZnO), indium oxide ($In_2O_3$), indium gallium oxide (IGO), and aluminum zinc oxide (AZO).

12. The organic light emitting diode display device of claim 1, further comprising:
a first capacitor electrode formed with a semiconductor material in a same layer as the active layer is formed; and
a second capacitor electrode formed so as to overlap the first capacitor electrode with a same layer and a same material as a layer and a material, respectively, of the gate electrode.

13. The organic light emitting diode display device of claim 12, wherein an impurity is doped into the first capacitor electrode.

14. The organic light emitting diode display device of claim 1, wherein the plurality of pixel metal layers include a first and a second pixel metal layer and the plurality of pixel transparent conductive layers include a first, a second and a third pixel transparent conductive layer, wherein the first pixel transparent conductive layer, the first pixel metal layer, the second pixel transparent conductive layer, the second pixel metal layer and the third pixel transparent conductive layer are sequentially stacked on the first insulation layer.

15. A method for manufacturing an organic light emitting diode display device comprising the steps of:
forming an active layer made of a semiconductor material on a substrate;
forming a first insulation layer for covering the active layer;
forming a gate electrode on the first insulation layer;
alternately stacking a plurality of pixel metal layers and a plurality of pixel transparent conductive layers on the first insulation layer, and patterning the alternately stacked pixel metal layers and pixel transparent conductive layers so as to form a pixel electrode comprised of the alternately stacked pixel metal layers and pixel transparent conductive layers, the gate electrode having a different configuration than the pixel electrode;
forming an auxiliary transparent conductive layer between the pixel electrode and the first insulation layer and between the gate electrode and the first insulation layer;
forming a second insulation layer for covering the gate electrode and revealing the pixel electrode;
forming a source electrode and drain electrode electrically connected to the active layer on the second insulation layer;
forming an organic emission layer on the pixel electrode; and
forming a common electrode on the organic emission layer.

16. The method of claim 15, wherein the pixel electrode is selectively formed between the step of forming the gate electrode and the step of forming the organic emission layer.

17. The method of claim 16, wherein the pixel electrode and the gate electrode are formed by different respective photolithography processes.

18. The method of claim 17, wherein the pixel electrode is formed in a same layer as a layer in which the gate electrode is formed.

19. The method of claim 15, wherein the pixel metal layer includes one of silver (Ag) and an alloy of silver.

20. The method of claim 15, wherein the plurality of pixel metal layers includes a first pixel metal layer and a second pixel metal layer, and the first pixel metal layer and the second pixel metal layer each have a thickness within a range of 20 Å to 130 Å.

21. The method of claim 20, wherein a sum of thicknesses of the first pixel metal layer and the second pixel metal layer is within a range of 100 Å to 200 Å.

22. The method of claim 15, wherein the pixel transparent conductive layer includes at least one of indium tin oxide (ITO), indium zinc oxide (IZO), zinc oxide (ZnO), indium oxide ($In_2O_3$), indium gallium oxide (IGO), and aluminum zinc oxide (AZO).

23. The method of claim 15, wherein the gate electrode includes at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

24. The method of claim 15, the auxiliary transparent conductive layer is comprised of at least one material selected from a group consisting of indium tin oxide (ITO), indium zinc oxide (IZO), zinc oxide (ZnO), indium oxide ($In_2O_3$), indium gallium oxide (IGO), and aluminum zinc oxide (AZO).

25. The method of claim 15, further comprising the step, after the gate electrode is formed, of doping an ion impurity into a partial region of the active layer by using the gate electrode as a mask.

26. The method of claim 15, further comprising the steps of:
forming an organic emission layer on the pixel electrode; and
forming a common electrode on the organic emission layer.

27. The method of claim 15, wherein the step of forming the active layer includes forming a first capacitor electrode, and the step of forming the gate electrode includes forming a second capacitor electrode so as to overlap the first capacitor electrode in the forming of the gate electrode.

28. The method of claim 27, wherein an impurity is doped into the first capacitor electrode.

* * * * *